United States Patent
Maxwell et al.

(10) Patent No.: US 7,239,047 B1
(45) Date of Patent: Jul. 3, 2007

(54) SWITCH DEVICE INCORPORATING CAPACITIVE OSCILLATOR

(75) Inventors: Leonard Maxwell, Coventry (GB); Lloyd McIntyre, Coventry (GB); Roy Warren, Southampton (GB); Stephen Roe, Conventry (GB); Jim Brooks, Coventry (GB); Helen Kendall, Coventry (GB)

(73) Assignee: Status Hi-Tech Limited, Coventry (GB)

(*) Notice: Subject to any disclaimer, the term of this patent is extended or adjusted under 35 U.S.C. 154(b) by 319 days.

(21) Appl. No.: 10/031,723

(22) PCT Filed: Jul. 20, 2000

(86) PCT No.: PCT/GB00/02812

§ 371 (c)(1),
(2), (4) Date: Apr. 29, 2003

(87) PCT Pub. No.: WO01/06652

PCT Pub. Date: Jan. 25, 2001

(30) Foreign Application Priority Data

| Jul. 20, 1999 | (GB) | ................................. 9916930.2 |
| Oct. 6, 1999 | (GB) | ................................. 9923562.4 |
| Feb. 11, 2000 | (GB) | ................................. 0003068.4 |
| Apr. 6, 2000 | (GB) | ................................. 0008310.5 |

(51) Int. Cl.
*H01H 36/00* (2006.01)
*H01H 63/00* (2006.01)
*H01H 67/00* (2006.01)

(52) U.S. Cl. ....................... 307/129; 307/116; 307/125

(58) Field of Classification Search ................. 307/116
See application file for complete search history.

(56) References Cited

U.S. PATENT DOCUMENTS

| 3,555,531 | A | * | 1/1971 | Montone ..................... 340/594 |
| 4,396,011 | A | * | 8/1983 | Mack et al. .................. 601/18 |
| 5,753,983 | A | * | 5/1998 | Dickie et al. ............. 307/141.4 |
| 5,940,499 | A | * | 8/1999 | Fujii et al. ............. 379/388.05 |
| 6,434,450 | B1 | * | 8/2002 | Griffin et al. .................. 701/1 |
| 6,866,102 | B2 | * | 3/2005 | Boyce et al. ................. 169/61 |

FOREIGN PATENT DOCUMENTS

| WO | WO 96/12291 | * | 4/1996 |
| WO | WO 97/01835 | * | 1/1997 |

OTHER PUBLICATIONS

Rios, Roberto J., Office Action mailed Apr. 8, 2004 in U.S. Appl. No. 10/460,944, Alexandria, Virginia, United States of America.

* cited by examiner

*Primary Examiner*—Brian Sircus
*Assistant Examiner*—Hal I. Kaplan
(74) *Attorney, Agent, or Firm*—Joseph G. Swan, P.C.

(57) ABSTRACT

A switch (10) comprises a face plate (16) and a single switch sensing oscillator (18) responsive to a switch activating presence. The oscillator (18) has a resistive component (36) connected to a sensing plate (38) which acts as a first capacitor plate. The face plate (16) is arranged to prevent electrical contact between the user and the oscillator (18). Any object, when placed adjacent the face plate (16), acts as a second capacitor plate which alters the frequency of the oscillator (18). A microprocessor (20) senses the smoke detector (62). In a further aspect the switch includes a mains electricity cable signal transmitter/receiver and a microprocessor whereby each such switch may communicate directly with another such switch.

15 Claims, 2 Drawing Sheets

SWITCH DEVICE INCORPORATING CAPACITIVE OSCILLATOR

Figure 1:
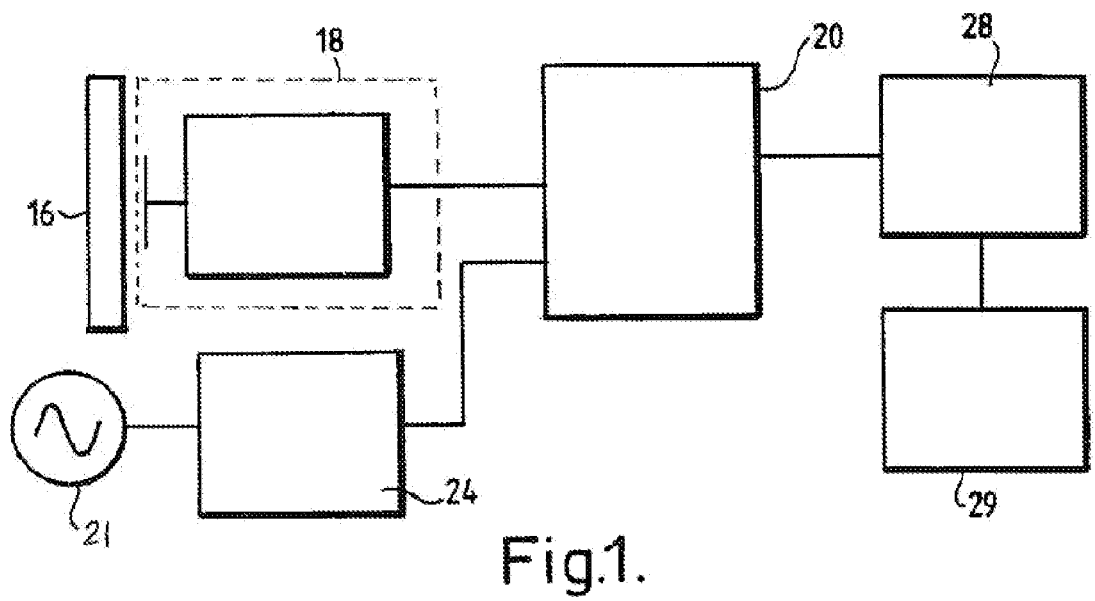

The invention relates to a switch and particularly to, although not exclusively limited to, a switch which requires no physical contact with a circuit.

Switches for electrical circuits normally comprise a physical break in the circuit which allows an operator to complete the circuit by actuating an appropriate lever. Conventional electric light switches are an example of such an arrangement where an insulated lever is connected to a break in the circuit and actuation of the lever completes the circuit to allow the light to be activated. Such switches have several drawbacks. Firstly, because the switch is a mechanical interface with the circuit the switch is subject to wear and may eventually fail. More importantly, conventional light switches cannot be used in environments where there is a likelihood that conductive material could cause either shorting of the circuit or an electric shock hazard. An example of such an environment would be a bathroom where there is a likelihood that the user may have wet hands when activating the switch. That presents significant risks of electric shock in the user. Consequently, such switches are not used in bathrooms and the switch is either arranged outside the bathroom or alternatively the switch is located in the ceiling and is actuated by means of a pull string.

Electronic switches, such as dimmers, have an arrangement of mechanical knobs that are used to set a reference trigger voltage to an electronic device located within the switch, such as a Triac, which connects AC power to the electric circuit when the reference voltage is reached or exceeded. Other implementations of the dimmer switch use a metallic or conductive faceplate, which provides a physical connection to the circuit located within the dimmer switch. When the face plate is touched it completes a circuit which affects an oscillator frequency or a mains hum detector which is then used to trigger an electronic device, such as a Triac, to connect AC power to the electric circuit. The power delivered to the electric circuit can be varied by increasing the length of time that the hand is held to the faceplate or by reducing the reference voltage to the trigger device.

It is an object of the invention to provide an improved switch.

According to a first aspect of the invention there is provided a switch device comprising a face plate and a single switch oscillator having a capacitive component, the capacitive component having a first capacitor plate arranged adjacent the face plate, the face plate preventing electrical contact between the user and the oscillator whereby an object placed adjacent the face plate acts as a second capacitor plate thereby altering the frequency of the oscillator, control means being provided to sense the change in frequency and to actuate the switch in response to such a change.

In that way a non-mechanical switch is provided which enables a circuit to be switched without physical contact by the user since the switch activation presence can be the physical proximity of, for example the user's hand, to the switch oscillator. There is no requirement for physical contact with the device since physical proximity of the user's hand with the switch oscillator will change the switch oscillator fundamental frequency which will activate the switch. The object could be an inanimate object such as a stick and there is no need for the object to be conductive. The object could be a hand of the user. Proximity of any object to the switch oscillator will cause stray capacitance in the oscillator and hence change the oscillator characteristics and operating frequency.

The switch can operate as a conventional on/off switch, or dimmer switch or provide other programmable functions without the need for a physical connection to the electric circuit located within the switch, thereby removing the risk of electric shock and allowing the switch to be used in locations otherwise precluded to an AC switch.

Because the switching is non-mechanical, the possibility of the switch arcing is eliminated. That renders the switch safe for use in areas of explosion hazard, for example petrol station forecourts, and places where flammable gas is used or stored.

The plate is preferably made from electrically insulating material. In that way the risk of electric shock is eliminated. The face plate is preferably arranged so that it can be retrofit to existing switch mountings. Alternatively, the face plate may be designed as a bespoke plate.

The detection of the shift in frequency of the switch oscillator is achieved within the micro controller by software, which is designed to filter out any noise spikes or frequency drift caused by manufacture or humidity or temperature increases or decreases.

To reduce the effect of frequency shifting in the switch oscillator due to manufacture, or an increase or decrease in temperature, the frequency from the oscillator is continually recalculated at a fixed period by the micro controller. The software within the micro-controller also preferably automatically detects the frequency of the mains supply to which it is connected via an AC zero detector circuit which allows the switch to be connected to mains supplies with differing frequencies. The software alters the firing signal to an AC trigger circuit based on the mains frequency calculated and therefore can automatically provide the correct firing pulses for the trigger circuit no matter what AC mains frequency is being generated.

Preferably, the components of the switching device are arranged on a printed circuit board.

In another embodiment several such switching devices may be arranged on a single circuit board adjacent a single face plate. In such a case the face plate may have markings thereon to illustrate where a user should touch the face plate in order to activate particular individual switching devices.

In one embodiment the switching device can be used to switch a light circuit. In such a case various control functions can be effected by means of the switch controlled by software in the light circuit. For example, gradual ramping up of current to the light to preserve bulb life, a dimmer facility, random light switching or timed light switching can also be provided. In addition, a comfort lamp function where the light is progressively dimmed to a nursery light level may be provided. Also timed gradual lighting up may be provided to act as an alarm to wake the user.

In a further embodiment, where the switch is connected to the light circuit, the switch includes an integrated smoke detector system which is electronically integrated with the light circuit corresponding to the switch. The smoke detector system comprises a smoke detector element and a sounder which are located within the switch. Upon detection of smoke, the sounder and the corresponding light circuit are activated.

According to a second aspect of the invention there is provided a wall mounted mains light switch having a smoke detector therein.

The switch may include a passive infra red (PIR) pryo sensor element or other movement and hear sensing device which, with the sounder, acts as a burglar alarm/deterrent.

According to a third aspect of the invention there is provided a mains light switch including a transmitter for sending outgoing signals along a mains electricity cable, a receiver for receiving incoming signals from the mains electricity cable and a control device arranged to process the incoming and outgoing signals.

Such a system allows the light switch units according to the third aspect of the invention to communicate with each other. Previous mains communication systems have relied on a central mains processor and all signals pass through the mains processor. Thus a substantial capital outlay is required to install a mains communication system in an average house. The switches made in accordance with the third aspect of the invention all carry the control device, such as a microprocessor. Thus each switch can act as a master. That enables extremely straightforward retrofitting of the system since there is no need for an expensive mains control processor. In a most preferred embodiment a switch having all of the features of the first, second and third aspects of the invention is provided.

In a preferred embodiment of any of the above aspects the switch may be connected to a pad capable of vibrating on application of electrical power. In that way, a hard of hearing user may be alerted to, for example, a fire in the house. The user may place the pad under their pillow at night or on a chair during the day. The vibration of the pad acts as a warning to the hard of hearing user. Alternatively, or in addition to the pad, each switch may be arranged to strobe lights in a room or to sound an integral buzzer.

Another alternative embodiment of switch includes a microphone arranged to receive sound from the room in which it is located. In that embodiment the signal received by the microphone may be transmitted via the mains cable to another light switch on the circuit. The signal can be played through a speaker on the other switch. In that way, a nursery intercom system may be provided. In a preferred embodiment the control unit in the switch may alter the light settings according to the sound level in the room. Thus, the light may be arranged to dim gradually to a gentle glow but to ramp up gradually in response to increased noise level, such as a baby crying. Instead of the actual sound from the room being played through the other switch, a noise level indicator may be provided, such as a series of LED's which are progressively illuminated as noise level increases. An alarm may be provided which sounds when the noise exceeds a certain level.

The aforementioned vibration pad could be provided in connection with the above embodiment to alert hard of hearing parents to a distressed child.

In the most preferred embodiment each switch incorporates the features of the first, second and third aspects of the invention, thereby providing a contactless switch which can be used in all areas, which provides smoke detection and which can communicate with other such switches down mains electricity cable.

In a further embodiment of the invention each switch includes some or all of the above mentioned functions, such as PIR sensing, nursery light level adjustment, nursery intercom, hard of hearing alert facility and/or any of the light control functions mentioned above, such as bulb life preservation, dimming, comfort lamp or random switching. The switch may be programmed with specific functions prior to installation. Alternatively, a selector may be provided so that the user may select the functions required after installation.

The selector may be a numbered dial or in a preferred version an LCD display may be provided with different switching areas allowing the user to cycle through lists of functions displayed on the display and to select specific functions.

The switch preferably comprises a microprocessor controller located within the, and attached to, the buildings mains wiring system. The microprocessor awaits one or more signal from the smoke detector system or PIR sensor to alert it to an alarm function. The microprocessor then operates, as well as the sounders and light circuits, functions such as the activation of a digital communicator or auto dialer to alert a central monitoring station or a designated key holder. The microprocessor may also operate a monitoring and control panel that indicates the type and source of any activation of any of the switches. The switches can, through the microprocessor, contact by telephone or other electronic means the controller and order it to activate any programmable functions which are attached.

Figure 2:
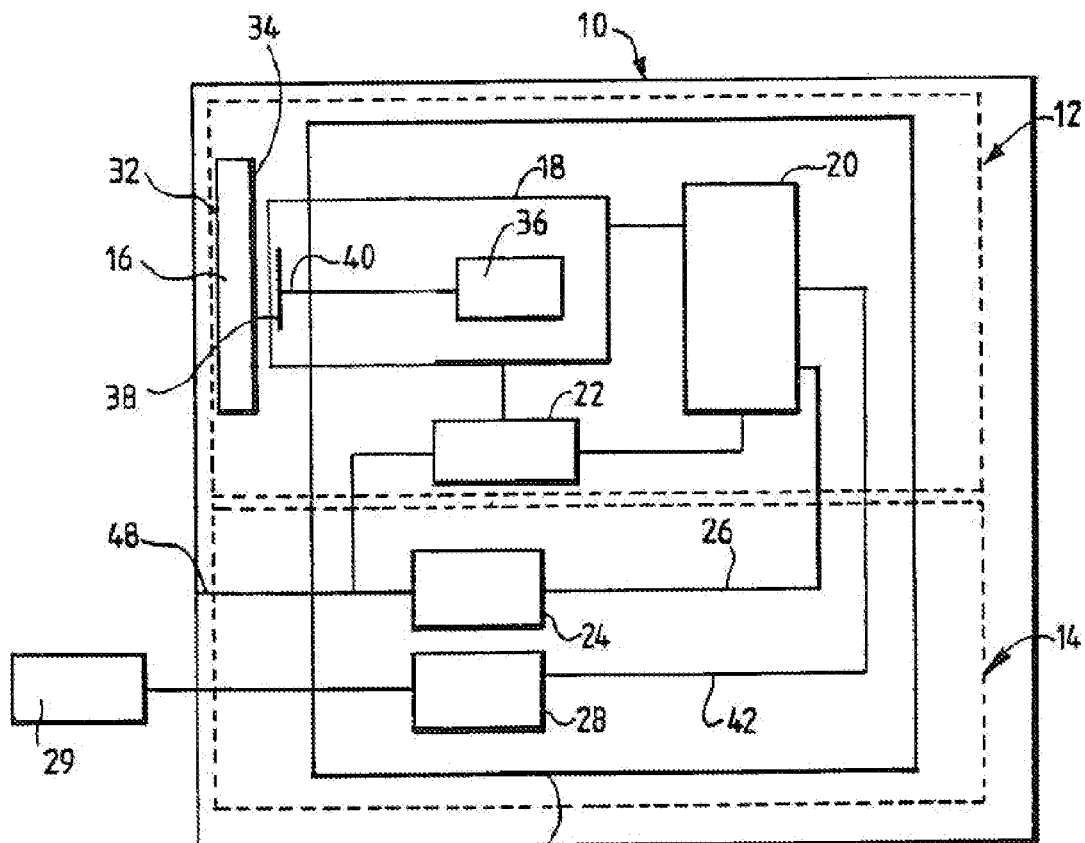
Figure 3:
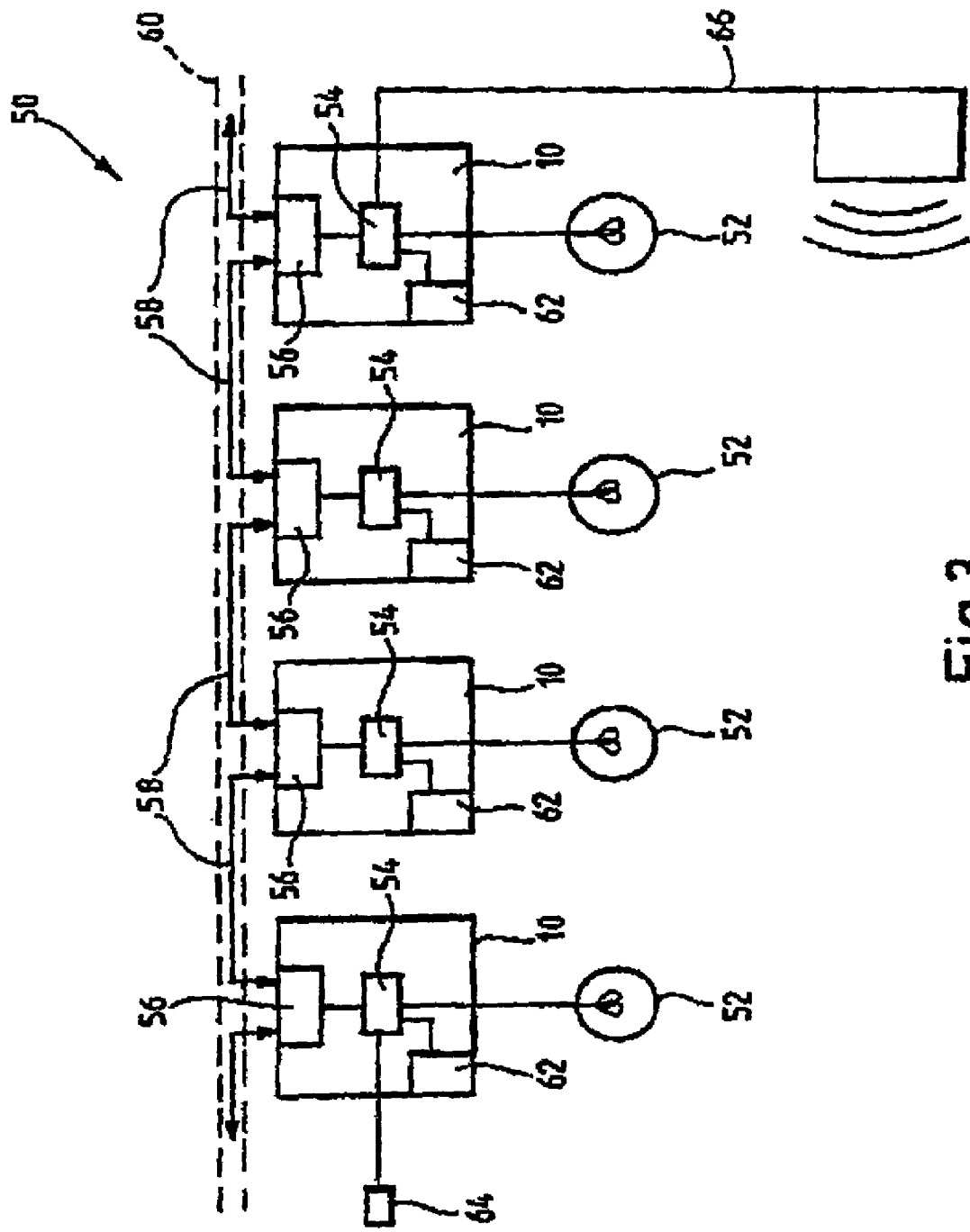

A specific embodiment of the invention will now be described by way of example with reference to the accompanying drawing, in which:

FIG. 1 shows a schematic circuit diagram of a contactless switch in accordance with the first aspect of invention, and FIG. 2 shows a more detailed schematic of the switch of FIG. 1; and FIG. 3 shows a schematic diagram of a series of switches in accordance with the first, second and third aspects of the invention.

Referring to FIGS. 1 and 2 a contactless switch 10 comprises a sensor part 12 and a switch part 14.

The sensor part 12 comprises a face plate 16, a switch sensing oscillator 18 responsive to a switch activating presence adjacent the face plate 16, a microprocessor 20 and a power circuit 22 which supplies power to the switch 10.

The switch part 14 comprises a mains zero crossing circuit 24 which sends a signal 26 to the micro processor 20 when the zero crossing of the AC mains 21 is detected, and a semiconductor power switch 28.

The circuitry of the sensor part and switch part 14 is mounted on a printed circuit board 30 (PCB)

The switch sensing oscillator 18 and other components are mounted on a printed circuit board 30.

The plate 16 is made from an electrically insulating material. The plate 16 has a front surface 32 and a rear surface 34. The plate 16 is mounted such that its front surface 32 faces an operator and its rear surface 34 faces the printed circuit board (PCB) 30 and in particular, the switch sensing oscillator 18. The face plate 16 is designed to fit pre-existing switch mountings.

The switch sensing oscillator 18 is an oscillator of known type, which comprises a resistive component 36 connected to a sensing plate 38. The oscillator 18 has a fundamental frequency determined by its components. The sensing plate 38 comprises one capacitor plate connected electrically to the resistive component 36. The plate 38 is mounted to the rear surface 34 of the face plate 16. The face plate 16 acts as the dielectric for the sensing plate 38. Consequently, the sensing plate 38 acts as a capacitor which allows the oscillator to generate an output signal at a predetermined frequency. The sensing plate 38 is connected to the rear of the faceplate 16 such that it cannot be contacted by an operator approaching the front surface 32.

In use, the operator of the switch places his hand adjacent the front surface 34 of the face plate 16. The hand of the operator acts as the second plate of the capacitor, the sensing plate 38 acting as the first plate. Consequently, the capacitance of the sensing plate 38/face plate 16 arrangement is changed significantly by the presence of the hand of the operator. That, in turn, alters the frequency of the output signal of the oscillator 18.

The output from the oscillator 18 is fed to a micro controller 20 which measures and calibrates the frequency received. The software in the micro controller 20 filters the signal received and decides if the switch is to be switched on or switched off.

The sensing plate 38 is formed from a conductive rubber. The plate 38 includes a spur 40 which projects from the plate 38 and connects the plate 38 to the printed circuit board 30. The advantage of the rubber spur is that it provides a resilient connection from plate 38 to PCB 30 which can conveniently be integrally moulded with the plate 38.

When the switch is switched on the software within the micro controller 20 analyses the signal 26 from the alternating current zero crossing detector 24 and calculates when the trigger signal 42 is sent to the semiconductor power switch 28, which comprises a Triac, that switches on the external circuit 29. While the switch is switched on the software within the micro controller 20 will continue to analyse the signal 26 from the alternating current zero crossing detector 24 and to generate the required trigger signal 42 for the semiconductor power switch 28 thereby keeping the external circuit 29 switched on. When the switch is switched off no signals 42 are sent to the semiconductor power switch 28 thereby keeping the external circuit 29 switched off.

A feedback path 48 is connected to a voltage generation circuit 22, which provides sufficient power to operate the circuit in the sensor part 12 and switch part 14 while the contactless switch is switched on or off.

Changes in the environmental conditions (i.e. a change in the temperature and/or pressure) can cause a change in the fundamental frequency of the switch-sensing oscillator 18. The software in the micro controller 20 recalculates the fundamental frequency of the switch oscillator 18 every fixed interval and therefore the switch re-calibrates itself to reduce drift within the oscillator circuit 18. When the contactless switch is first connected to the mains supply the software within the micro controller 20 calculates the frequency of the alternating voltage that it is connected to. This allows the switch to be used in countries that have differing AC frequencies (i.e. 50 Hz or 60 Hz).

The external circuit 29 may be a mains light circuit and may operate an incandescent bulb or a low voltage bulb, a fluorescent bulb or a lower energy bulb.

The feedback path 48 is connected, for example via a capacitor (not shown), to the sensor part 12 and provides sufficient power to operate circuitry in the sensor part 12.

Changes in the environmental conditions (ie. a change in the temperature and/or pressure) can cause a change in the fundamental frequency of the switch sensing oscillator 18.

The non-conductive nature of the plate 16 means that the contactless switch 10 of the present invention does not expose the user to an electric shock hazard. Consequently, the present invention is particularly useful where a risk of electric shock exists, for example in bathrooms, kitchens, shower enclosures, steam rooms etc.

Where control of a d.c. circuit is desired the semiconductor power switch 28 may comprise a transistor.

The printed circuit board 30 may have a plurality of sensor parts 12 and switch parts 14 positioned on it, thus making multiple switching possible from a single plate 16. Inked printed text and/or margins could be applied to the front surface 32 of the plate 16 sharing the various touch positions. The rear surface 34 may be fitted with one or more low intensity light emitting indicators which illuminate, thereby making the plate 16 visible in darkness.

A further embodiment of the design includes a safety circuit which prevents an electric shock to a person replacing a lamp or touching the two conducting prongs within the lamp holder.

With the inclusion of software-controlled micro circuitry further control functions are incorporated. For example, when the external circuit is a light circuit, a tungsten lamp life extender, auto or resettable lamp brightness control, auto lamp turn off after pre-set time expires, random light turn on/off, or slow fadeout control for children's bedrooms functions can be incorporated.

When the external circuit 29 is a light circuit and the light itself is a tungsten lamp, the control circuit will gradually increase the voltage supplied to the lamp. In that way, cold inrush current is reduced and early burn-out of the lamp is prevented.

A dimmer is provided to enable control of the intensity of the lamp. By maintaining the hand over the plate 16 for a predetermining period, a dimmer mode is activated. Maintaining the hand in place results in successive dimming of the lamp. The hand can then be removed from the switch when the desired lamp intensity is reached.

In the present embodiment further functions are incorporated and may be indicated to the user by means of pulsing the lamp on and off. To enter a programming mode to access such functions the lamp is turned off and the hand is maintained over the plate 16 for predetermined period. The circuit will then enter auto-turn off programming mode. Each lamp pulse indicates a one minute delay before auto turn-off whereby the lamp will switch itself off automatically after the preset number of minutes have elapsed beyond switching on of the lamp.

Random light turn on/off for security purposes follows the steps above for controlling the lamp. The hand, etc is maintained for a predetermined period past the minimum dimness of the lamp and then each lamp pulse indicates a one hour delay before turn on, allowing a repeatable sequence to be maintained for each 24 hour sequence until disabled.

A comfort lamp function provides a progressive dimming over time to a warm comfort lamp level. The function is set from switching the lamp on by maintaining the hand over the face plate until one delayed step in lamp level occurs then removing the hand. Over approximately a five hour period, which can be altered if desired, the lamp will dim down to a pre-set brightness level to allow just a warm comfort lamp to remain on.

All of the above functions are programmed by the user touching the face plate and the various control options are presented sequentially. Alternatively, the face plate 16 may include a dial to cycle through control options or an LCD display which indicates which function/functions are active and allows selection of such functions from a displayed list.

A plurality of light switches 10 as described above may be incorporated into a mains light circuit system 50 as shown in FIG. 3.

In FIG. 3 four light switches 10 are shown as part of a mains light circuit system 50.

Each switch 10 comprises a switch as described in FIG. 1 which allows contactless switching of a light 52. Each switch 10 includes a microprocessor control 54 which incorporates the switching part 14 of the contactless switch 10 and which also provides control functions for the light circuit and other systems to be described below. Each switch 10 also incorporates a mains electricity cable signal transmitter/receiver 56 which allows signals 58 to be sent and received along a mains electricity cable 60 (shown in broken lines).

Each switch 10 also includes a smoke detector assembly 62 which communicates with the control 54. The smoke detector assembly 62 comprises a detector (not shown) and a sounder, such as a buzzer (also not shown).

The left-hand most switch 10 as viewed in FIG. 3 has an integral microphone 64, although a socket for a separate external microphone could be used instead.

The right-hand most switch 10 as viewed in FIG. 3 receives a lead 66 for a vibration pad 68.

The switch 10 may also include a series of coloured LED's on the face plate 16 and/or an LCD display also on the face plate 16. Each switch 10 can function as a programmable light switch allowing the lighting functions described above to be implemented in each room. In addition, the smoke detectors 62 in each light switch act as an integrated alarm system for a building in which the mains light circuit system 50 is installed. In particular, the smoke detector 62 is arranged to sense smoke particles passing through the face plate 16 of the switch 10. In the event that smoke is detected then the sounder in the smoke detector system 62 is activated and an alert signal is passed to the microprocessor control 54. The microprocessor control 54 then activates the lighting in a room where smoke is detected. Additionally, the microprocessor control 54 causes transmitter 56 to send an alert signal 58 along the mains cable 60 to other such switches 10 in the mains light circuit system 50. On receipt of an alert signal indicating smoke detection in a room the respective microprocessor controls 54 of the other switches 10 cause the sounder of the smoke detector system 62 to sound and strobe the lights 52 in the respective rooms. The light 52 in the smoke affected area may remain fully on. Alternatively, the light in the room which is affected by smoke may strobe and the other lights may simply be raised to full light levels to illuminate the area. Another function that is envisaged is that selective areas may be illuminated in order to indicate the direction of an escape route to the occupants of the building while lights in the affected room will continue to strobe so that emergency services can quickly locate the affected areas. In a most preferred embodiment the microprocessor control 54 can forward a signal to telephone apparatus to send an automatic emergency signal to the emergency services indicating the nature and location of the emergency.

The microphone 64 in the left-hand most switch 10 in FIG. 3 will act as a nursery monitoring system. The switch 10 is installed in the nursery and the microphone will monitor the level of sound in the nursery. Should the level of sound exceed a predetermined level then an alert signal 58 can be sent via mains cable 60 to other light switches 10 on the circuit system 50 and those light switches can be arranged to sound a warning to occupants of the rooms to alert parents to a distressed child. In addition, where the light switch 10 incorporates a series of coloured LED's the LED's can be illuminated in sequence indicating increased noise levels in the child's room. Still further, each switch may include a speaker to play the noise from the child's room, preferably on demand by the parent so that the nature of the sound can be determined. In that way, erroneous alerts are minimised. In the switch which is to be arranged in the nursery the light can be programmed with a comfort lamp function mentioned above and the light level can be varied according to the noise level in the room. In particular, if the noise level exceeds a predetermined level then full light levels can be returned so that a parent or carer entering the room to determine the reason for the child's distress does not have to enter a dark room.

The right-hand most switch 10 shown in FIG. 3 is equipped with a vibration pad which can be used to alert the hard-of-hearing in the event of smoke detection or increased noise levels in a nursery.

Although not shown, each switch may also incorporate a passive infrared movement sensor which will detect movement in and out of a room. Alert signals 58 can be passed from room to room in that way and the aforementioned connection via telecommunications apparatus to the emergency services can also be affected by the appropriate microprocessor control 54. The smoke detector sounder in the smoke detector 62 can be used as an audible to deter burglars and strobing of the lights can be affected in order to confuse a burglar in a dwelling.

Each switch 10 in the system described acts as its own master. Consequently, there is no need to incorporate a separate communication system which could be by-passed by an intruder. In order to circumvent the present system, every light switch must be destroyed or deactivated in some way or the mains cabling must be cut which is not practicable. The other advantage of the present system is its retrofittability. In particular, as each switch acts as a master individual switches or pairs of switches can be purchased and the system can gradually be built up into a fully integrated system. For example, the user may primarily be interested in the nursery facility so he/she may wish to purchase the microphone equipped switch for the nursery and another switch, for example, a lounge room. Where a hard-of-hearing person is interested in a smoke detector alert they may purchase a switch equipped with a vibration pad and one or more switches for installation in areas which present a fire hazard. Purchase of further switches will not affect the systems operation since each switch acts as a master and simply forwards appropriate alert signals along the mains cable and the alert signals are interpreted on receipt by the microprocessor control of the local switch.

Each microprocessor 54 controller can also operate other functions such as the activation of a digital communicator or autodialler alerting a central monitoring station or a designated keyholder, the operation of internal and external sounders and external security lights or strobe systems. The microprocessor controller may also operate a monitoring and control panel that will indicate the type and source of any activation by any of the attached switches PIR sensors or smoke detection systems.

Each switch 10 can, through its microprocessor controller, be contacted by telephone, computer or other electronic means and be ordered to activate any of the programmable functions that are attached. In the other direction each controller can be used remotely to operate other appliances connected to and programmed in to the switch series.

Other applications of the contactless switch 10 include, switching electric fans, air conditioning, central heating, kitchen appliances, door bells, CNC machine data entry where the environment is oily, vending machines for vend selection, bank cash-point machines numerical keypads mounted behind plastic polycarbonate sheet for vandal resistance, hospital theatre equipment and appliances where hygiene is of paramount importance, access-control in "clean" rooms, public toilets in restaurants and food chains for opening foot-controlled solenoid-operated taps.

The contactless switch 10 could also have automobile applications. This type of switch 10 would provide vehicle console/dashboard designers with unlimited design possibilities. One example is to mount the contactless switch 10 behind the dashboard such that the plate 16 is co-planar with the dashboard which is less obtrusive than conventional switches/dials and the absence of protrusions makes it much safer than the conventional dash board in the event of a crash.

In this application, the contactless switch 10 would be normally fitted with bi-coloured l.e.d. indicators and/or an array showing the switch status, i.e. either on or off or made selected, this also would aid finding the switch at low ambient light levels.

The invention claimed is:

1. A switch device comprising a face plate and a single switch oscillator having a capacitive component, the capacitive component having a first capacitor plate arranged adjacent the face plate, the face plate preventing electrical contact between the user and the oscillator whereby an object placed adjacent the face plate acts as a second capacitor plate thereby altering a frequency of the oscillator, control means being provided to sense the change in frequency and to actuate the switch in response to such a change,
wherein the frequency from the oscillator is recalculated at fixed periods by the control means.

2. A switch device according to claim 1,
wherein detection of the change in frequency of the switch oscillator is achieved within the control means by software, and
wherein the software is arranged to filter out noise and/or frequency drift.

3. A switch device according to claim 1 in which the face plate is made from electrically insulating material.

4. A switch device according to claim 1 in which the face plate is arranged so that it can be retrofit to existing switch mountings.

5. A switch device according to claim 1 in which the switching device is used to switch a light circuit and in which software and/or hardware within the light circuit provides one or more of the following functions:
 a) gradual ramping up of current to the light to preserve bulb life,
 b) dimmer function
 c) random light switching
 d) timed light switching
 e) comfort light function
 f) gradual lighting up for use as an alarm.

6. A switch according to claim 1 in which the switch is programmable by a user.

7. A switch according to claim 6 in which the programming of the switch is effected by the user selecting a function from a list of functions and logging the selection on the switch.

8. A switch device comprising a face plate and a single switch oscillator having a capacitive component, the capacitive component having a first capacitor plate arranged adjacent the face plate, the face plate preventing electrical contact between the user and the oscillator whereby an object placed adjacent the face plate acts as a second capacitor plate thereby altering a frequency of the oscillator, control means being provided to sense the change in frequency and to actuate the switch in response to such a change,
wherein software within the control means automatically detects a frequency of a mains supply to which it is connected, via an AC zero detector circuit.

9. A switch device according to claim 8 in which the software alters a firing signal to an AC trigger circuit based on the detected frequency of the mains supply.

10. A switch device as claimed in claim 8,
wherein detection of the change in frequency of the switch oscillator is achieved within the control means by software, and
wherein the software is arranged to filter out noise and/or frequency drift.

11. A switch device according to claim 8 in which the face plate is made from electrically insulating material.

12. A switch device according to claim 8 in which the face plate is arranged so that it can be retrofit to existing switch mountings.

13. A switch device according to claim 8 in which the switching device is used to switch a light circuit and in which software and/or hardware within the light circuit provides one or more of the following functions:
 a) gradual ramping up of current to the light to preserve bulb life,
 b) dimmer function
 c) random light switching
 d) timed light switching
 e) comfort light function
 f) gradual lighting up for use as an alarm.

14. A switch according to claim 8 in which the switch is programmable by a user.

15. A switch according to claim 14 in which the programming of the switch is effected by the user selecting a function from a list of functions and logging the selection on the switch.

* * * * *